US011621676B2

(12) United States Patent
Cook et al.

(10) Patent No.: US 11,621,676 B2
(45) Date of Patent: Apr. 4, 2023

(54) AUTO-LINEARIZING AMPLIFIER

(71) Applicant: SKYWORKS SOLUTIONS, INC., Irvine, CA (US)

(72) Inventors: Mackenzie Brian Cook, Kanata (CA); Bharatjeet Singh Gill, Ottawa (CA)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 107 days.

(21) Appl. No.: 17/121,906

(22) Filed: Dec. 15, 2020

(65) Prior Publication Data

US 2022/0190786 A1 Jun. 16, 2022

(51) Int. Cl.
*H03F 1/26* (2006.01)
*H03F 1/32* (2006.01)
*H03F 3/24* (2006.01)
*H03F 1/56* (2006.01)
*H03F 1/22* (2006.01)
*H03F 1/30* (2006.01)

(52) U.S. Cl.
CPC ............... *H03F 1/32* (2013.01); *H03F 1/565* (2013.01); *H03F 3/24* (2013.01); *H03F 1/223* (2013.01); *H03F 1/302* (2013.01); *H03F 2200/318* (2013.01)

(58) Field of Classification Search
CPC ... H03F 1/32; H03F 1/565; H03F 3/24; H03F 2200/318; H03F 3/1935; H03F 3/193; H03F 2200/372; H03F 1/22; H03F 1/223; H03F 2200/294

USPC .................................. 330/277, 283, 296, 311
See application file for complete search history.

(56) References Cited

U.S. PATENT DOCUMENTS

| | | | | |
|---|---|---|---|---|
| 5,990,740 A | * | 11/1999 | Groe | H03F 1/3211 330/252 |
| 6,580,319 B1 | * | 6/2003 | Cummings | H03F 1/30 330/144 |
| 9,035,697 B2 | * | 5/2015 | Youssef | H03F 1/3205 330/311 |
| 2015/0188500 A1 | * | 7/2015 | Kang | H03F 1/223 330/293 |

* cited by examiner

*Primary Examiner* — Khanh V Nguyen
(74) *Attorney, Agent, or Firm* — Lando & Anastasi, LLP

(57) ABSTRACT

Examples of the disclosure include an amplifier system comprising an amplifier having an input to receive an input signal, and an output to provide an amplified output signal, the amplifier having a power level indicative of at least one of the input signal power and the amplified output signal power, and a linearizer coupled to the amplifier and having a plurality of modes of operation including a fully disabled mode and a fully enabled mode, the linearizer being configured to determine the power level of the amplifier, select a mode of operation of the plurality of modes of operation based on the power level of the amplifier, determine one or more linearization parameters corresponding to the selected mode of operation, and control linearization of the amplified output signal based on the determined one or more linearization parameters.

20 Claims, 9 Drawing Sheets

AUTO-LINEARIZING AMPLIFIER

BACKGROUND

1. Field of Invention

The present disclosure relates generally to auto-linearizing amplifiers.

2. Discussion of Related Art

Amplifiers are constructed to receive an input signal, amplify the input signal by a gain value, and output the amplified signal. Ideally, the gain value remains constant over a range of input signal values. That is, an output signal provided by an amplifier ideally has a linear gain with respect to the input signal. In practice, many amplifiers exhibit non-linear behavior, particularly for higher-power input signals. Linearizers, which may be implemented via one of several topologies, address the foregoing concerns by attempting to linearize the output signal provided by the amplifier. That is, linearizers operate to maintain a constant amplifier gain at an output of the amplifier over a range of input signal power levels.

SUMMARY OF INVENTION

According to one aspect there is provided an amplifier system comprising an amplifier having an input to receive an input signal, and an output to provide an amplified output signal, the amplifier having a power level indicative of at least one of the input signal power and the amplified output signal power, and a linearizer coupled to the amplifier and having a plurality of modes of operation including a fully disabled mode and a fully enabled mode, the linearizer being configured to determine the power level of the amplifier, select a mode of operation of the plurality of modes of operation based on the power level of the amplifier, determine one or more linearization parameters corresponding to the selected mode of operation, and control linearization of the amplified output signal based on the determined one or more linearization parameters.

In various examples, the plurality of modes of operation includes a plurality of discrete modes of operation. In some examples, the plurality of modes of operation includes a plurality of analog modes of operation. In at least one example, the amplifier system includes a bias generator configured to provide one or more bias signals to the amplifier, wherein the linearizer is configured to determine the one or more linearization parameters by determining a respective bias level for each of the one or more bias signals and providing one or more control signals indicative of the determined respective bias levels to the bias generator. In some examples, the amplifier includes a plurality of resistive, inductive, and/or capacitive components to control an amplification of the amplified output signal, and wherein in determining the one or more linearization parameters, the linearizer is configured to determine one or more electrical parameters for at least one component of the plurality of resistive, inductive, and/or capacitive components and control the at least one component to have the one or more electrical parameters.

In at least one example, in controlling the at least one component to have the one or more electrical parameters, the linearizer is configured to control a component topology of the at least one component. In various examples, in controlling the component topology of the at least one component, the linearizer is configured to electrically connect or disconnect one or more inductors, capacitors, and/or resistors in the at least one component. In some examples, the linearizer is configured to select the mode of operation of the plurality of modes of operation based on a present mode of operation of the linearizer of the plurality of modes of operation and based on the power level of the amplifier.

According to one aspect there is provided a method of controlling a linearizer coupled to an amplifier having a power level indicative of at least one of an input signal received by the amplifier and an amplified output signal provided by the amplifier, the linearizer having a plurality of modes of operation including a fully disabled mode and a fully enabled mode, the method comprising determining the power level of the amplifier, selecting a mode of operation of the plurality of modes of operation based on the power level of the amplifier, determining one or more linearization parameters corresponding to the selected mode of operation, and controlling linearization of the amplified output signal based on the determined one or more linearization parameters.

In various examples, selecting the mode of operation of the plurality of modes of operation includes selecting a discrete mode of operation of a plurality of discrete modes of operation. In some examples, selecting the mode of operation of the plurality of modes of operation includes selecting an analog mode of operation of a plurality of analog modes of operation. In at least one example, the linearizer is coupled to a bias generator configured to provide one or more bias signals to the amplifier, and wherein determining the one or more linearization parameters includes determining a respective bias level for each of the one or more bias signals, and providing one or more control signals indicative of the determined respective bias levels to the bias generator.

In some examples, the amplifier includes a plurality of resistive, inductive, and/or capacitive components to control an amplification of the amplified output signal, and wherein determining the one or more linearization parameters includes determining one or more electrical parameters for at least one component of the plurality of resistive, inductive, and/or capacitive components, and controlling the at least one component to have the one or more electrical parameters. In various examples, controlling the at least one component to have the one or more electrical parameters includes controlling a component topology of the at least one component. In at least one example, controlling the component topology of the at least one component includes electrically connecting or disconnecting one or more inductors, capacitors, and/or resistors in the at least one component. In various examples, selecting the mode of operation of the plurality of modes of operation is performed based on a present mode of operation of the plurality of modes of operation and based on the power level of the amplifier.

According to one aspect there is provided a linearizer coupled to an amplifier having a power level indicative of at least one of an input signal received by the amplifier and an amplified output signal provided by the amplifier, the linearizer having a plurality of modes of operation including a fully disabled mode and a fully enabled mode, and being configured to determine the power level of the amplifier, select a mode of operation of the plurality of modes of operation based on the power level of the amplifier, determine one or more linearization parameters corresponding to the selected mode of operation, and control linearization of the amplified output signal based on the determined one or more linearization parameters.

In various examples, the linearizer is further configured to be coupled to a bias generator configured to provide one or more bias signals to the amplifier, and wherein in determining the one or more linearization parameters, the linearizer is configured to determine a respective bias level for each of the one or more bias signals and provide one or more control signals indicative of the determined respective bias levels to the bias generator. In at least one example, the amplifier includes a plurality of resistive, inductive, and/or capacitive components to control an amplification of the amplified output signal, and wherein in determining the one or more linearization parameters, the linearizer is configured to determine one or more electrical parameters for at least one component of the plurality of resistive, inductive, and/or capacitive components and control the at least one component to have the one or more electrical parameters. In some examples, in controlling the at least one component to have the one or more electrical parameters, the linearizer is configured to electrically connect or disconnect one or more inductors, capacitors, and/or resistors in the at least one component.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Figure 1:
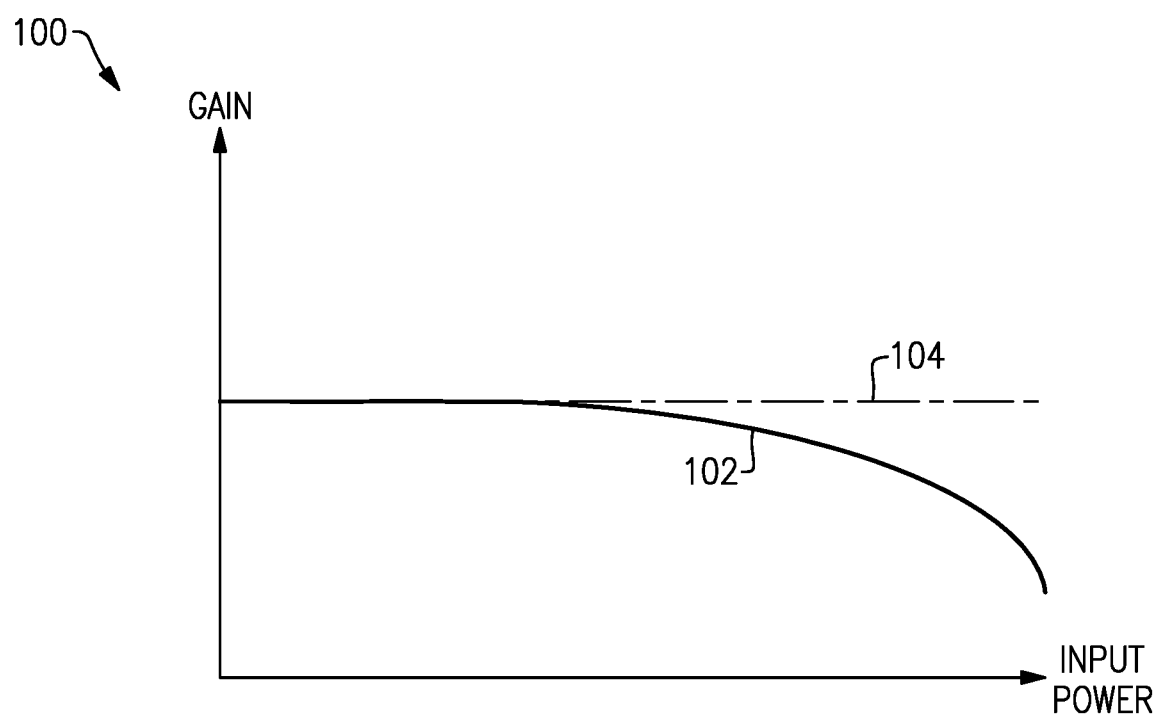
FIG. 1 illustrates a graph of an example amplifier gain as a function of input signal power according to an example.

As discussed above, amplifiers may exhibit non-linearity over a complete range of input signal power values. For example, FIG. 1 illustrates a graph 100 of an example amplifier gain as a function of input signal power. A y-axis of the graph 100 indicates an actual gain of the amplifier. An x-axis of the graph 100 indicates an input power of a signal provided to the amplifier. A first trace 102 indicates an actual gain of the amplifier as a function of input power without linearization. A second trace 104, illustrated in phantom, indicates an ideal (that is, linear) gain of the amplifier as a function of input power.

Ideally, the first trace 102 should approximate the second trace 104 as nearly as possible. As indicated by the first trace 102, however, an actual amplifier gain may be non-linear with respect to input power. Accordingly, amplifiers often include, or are otherwise coupled to, linearizers configured to linearize an amplifier gain. Linearizers may be implemented using any of several known topologies to accomplish the foregoing, including a feedback topology, a feed-forward topology, a pre-distortion topology, and others. Linearizers operate to correct operation of the amplifier such that the first trace 102 approximates the second trace 104 more closely.

A divergence between an actual amplifier gain and an ideal amplifier gain is typically not uniform over a range of input power values. As indicated by the graph 100, in some amplifiers the first trace 102 increasingly diverges from the second trace 104 as the input power increases. Accordingly, linearizers may provide more advantages (for example, by providing greater gain correction) for higher input power levels, because an actual gain of the amplifier may diverge most significantly from an ideal gain of the amplifier at higher input power levels.

Linearizers may provide fewer advantages for lower input power levels. Because the actual gain of the amplifier may not significantly diverge from the ideal gain of the amplifier, less correction is necessary, and the benefit of the linearizer may thus be less pronounced. Moreover, in some examples, linearizers may have detrimental effects on operation of the amplifier for lower-power input signals. For example, linearizers may negatively impact small signal performance by detrimentally impacting a gain and noise figure of the amplifier. Accordingly, while implementing a linearizer may be especially advantageous for higher input power signals, the linearizer may have more disadvantages for lower input power signals where gain correction is less pronounced and the gain and noise figure may have a more negative impact.

Examples of the disclosure avoid or mitigate the foregoing disadvantages by providing an auto-linearizing amplifier which provides varying degrees of linearization. In various examples, the auto-linearizing amplifier includes a linearizer having operating parameters that vary according to a power level of the amplifier (including, for example, a power level of an input signal and/or a power level of an output signal). The operating parameters control a degree to which the linearizer linearizes an output signal provided by the amplifier. As the power level of the amplifier increases, the linearizer provides a greater degree of linearization such that disadvantageous effects of linearizing lower power input signals are minimized. In a first example, the linearizer has multiple discrete linearization states. In a second example, the linearizer ramps up a degree of linearization over an analog ramp. In various examples, the linearizer includes a degree of hysteresis to avoid rapid fluctuation between linearization states. Accordingly, the linearizer mitigates or avoids the disadvantageous effects of operating on lower input power signals while still linearizing higher input power signals by ramping up a degree of linearization as a function of power.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Though the components of several views of the drawings herein may be shown and described as discrete elements in a block diagram and may be referred to as "circuitry," unless otherwise indicated, the elements may be implemented as one of, or a combination of, analog circuitry, digital circuitry, or one or more microprocessors executing software instructions. Unless otherwise indicated, signal lines may be implemented as discrete analog or digital signal lines. Some of the processing operations may be expressed in terms of calculating, determining, and/or ascertaining. The equivalent of calculating, determining, and/or ascertaining can be performed by other analog or digital processing techniques and are included within the scope of this application. Unless otherwise indicated, signals may be encoded in either digital or analog form; conventional digital-to-analog or analog-to-digital converters may not be shown in the drawings.

Figure 2:
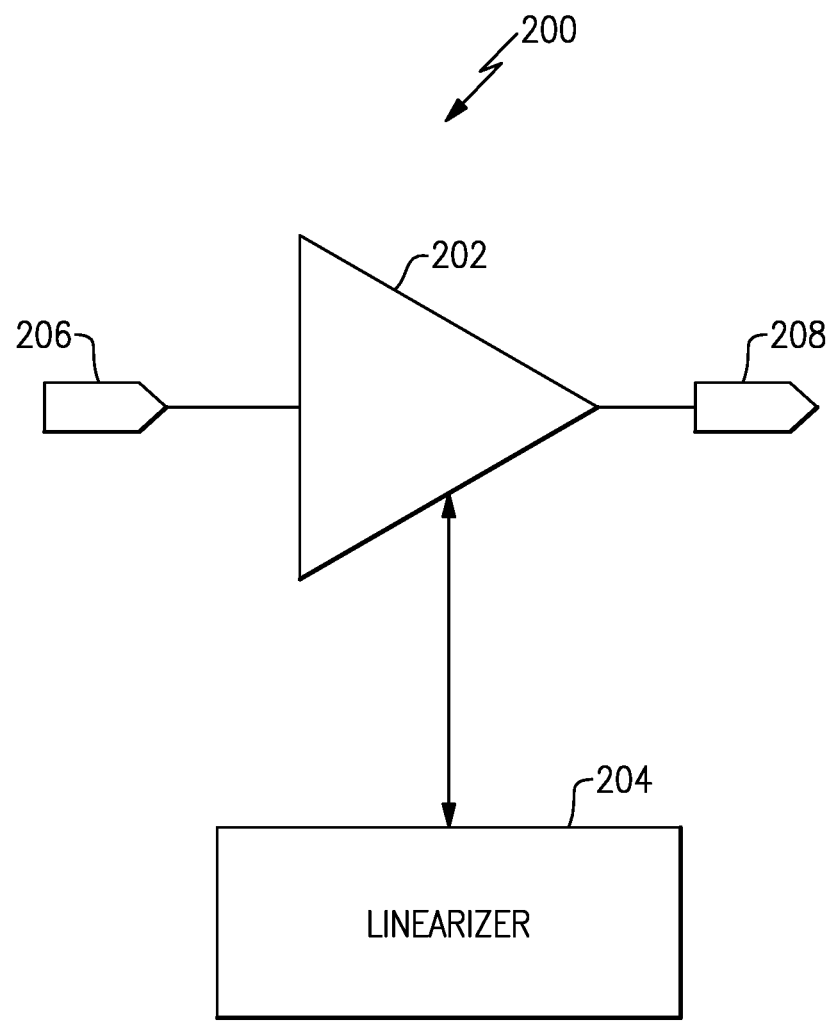
FIG. 2 illustrates a block diagram of an amplifier system according to an example.

FIG. 2 is a block diagram of one example of an amplifier system 200. The amplifier system 200 includes a power amplifier 202, a linearizer 204, an input signal path 206, and an output signal path 208. The power amplifier 202 and the linearizer 204 are illustrated as separate entities for purposes of explanation. In some embodiments, components of the power amplifier 202 may be distinct from components of the linearizer 204, whereas in alternate embodiments, one or more components of the power amplifier 202 may also be components of the linearizer 204. For example, all or some of the components of the linearizer 204 may be included within the power amplifier 202, and vice-versa.

The power amplifier 202 is configured to receive an input signal from the input signal path 206, amplify the input signal, and provide an amplified output signal to the output signal path 208. For example, the power amplifier 202 may be used to boost the strength of a signal having a relatively low power. In various embodiments, the amplified signal may be used for various purposes, such as driving the antenna of a wireless device. Accordingly, the power amplifier 202 may be included in numerous devices in which management of a signal is important, such as a mobile phone.

In various examples, the linearizer 204 is configured to provide linearization of an output signal provided by the power amplifier 202 to the output signal path 208 such that an amplified signal provided at the output signal path 208 maintains an approximately constant gain value. The linearizer 204 may measure a power level of the power amplifier 202 and adjust an amount of linearization provided to the output signal based on the measured power level. For example, the linearizer 204 may increase an amount of linearization provided to the power amplifier 202 as a power level of the power amplifier 202 increases. In various examples, a power level (measured, for example, in Watts) may include a power level of a signal received at the input signal path 206, a power level of a signal provided at the output signal path 208, a power level of a signal internal to the power amplifier 202 and received at the input signal path 206, or a power level of another signal related to operation of the amplifier 202.

Figure 3:
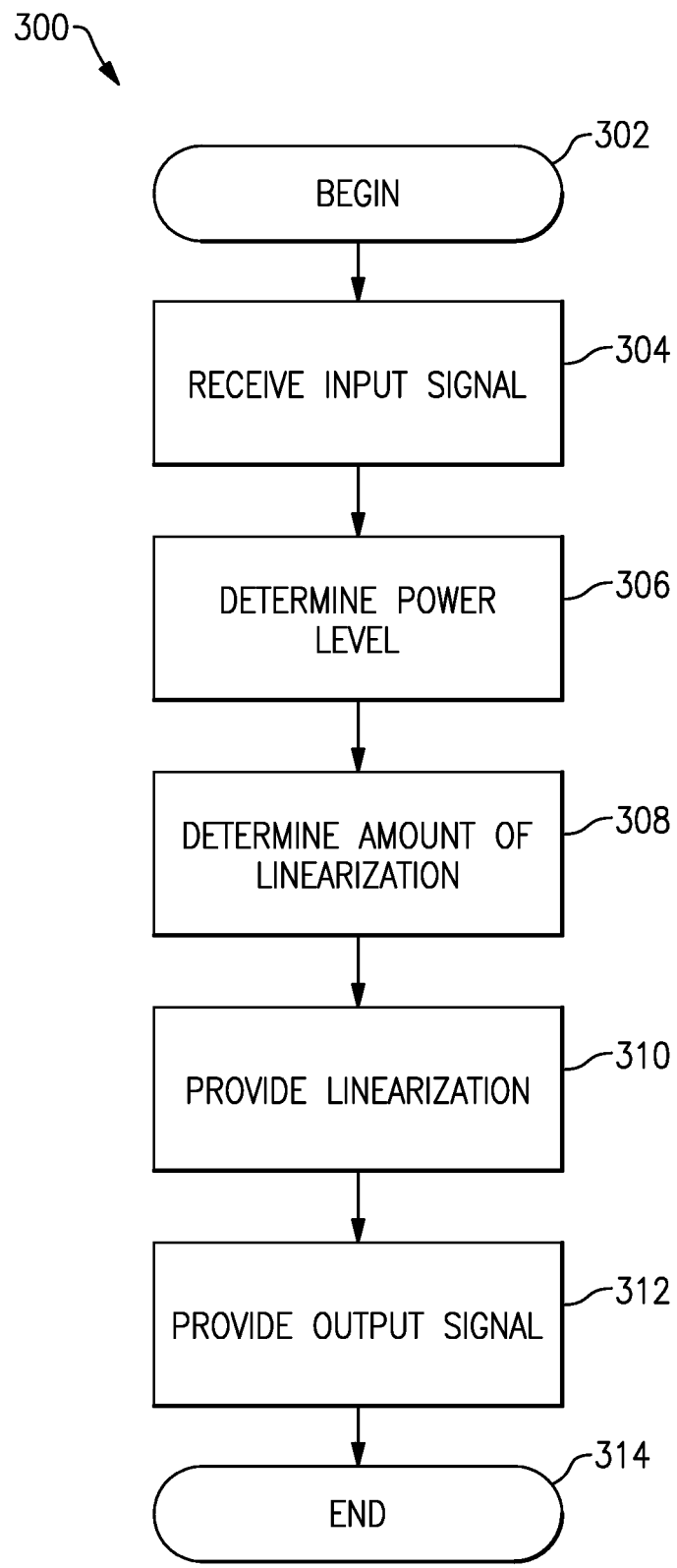
FIG. 3 illustrates a process of operation of the amplifier system according to an example.

FIG. 3 illustrates a process 300 of operation of the amplifier system 200 according to an example. At act 302, the process 300 begins. At act 304, an input signal is received. For example, the input signal may be received by the power amplifier 202 via the input signal path 206. The input signal may be any type of signal for which amplification is desired. For purposes of explanation only, an example is provided in which the input signal is a radio-frequency (RF) signal.

At act 306, a power level of the power amplifier 202 is determined by the linearizer 204. As discussed above, the power level may be a power level of any signal related to operation of the power amplifier 202, such as a power level of the input signal received from the input signal path 206, a power level of an output signal provided to the output signal path 208, and so forth. The linearizer 204 may include, or be otherwise coupled to, one or more components configured to measure electrical characteristics such as a power level, a current, a voltage, or other electrical characteristics. For example, the linearizer 204 may be communicatively coupled to one or more voltage, current, and/or power sensors within the power amplifier 202 and receive measurements indicative of the power level from the one or more sensors.

At act 308, an appropriate amount of linearization is determined by the linearizer 204. As discussed above, an amount of linearization provided by the linearizer 204 may increase as a power level of the power amplifier 202 increases. Accordingly, the linearizer 204 may determine an amount of linearization that corresponds to the power level determined at act 306. As discussed in greater detail below, the amount of linearization provided by the linearizer 204 may increase in a stepwise fashion, an analog fashion, or another fashion, and may include hysteresis.

At act 310, linearization is provided to the power amplifier 202 by the linearizer 204. For example, the linearizer 204 may be configured to provide pre-distortion linearization, feedback linearization, feed-forward linearization, or another type of linearization, in an amount determined at act 308. In some examples, act 310 may be optional. For example, it may be determined at act 308 that no linearization is necessary because, for example, a power level of the power amplifier 202 is too low to warrant linearization. In examples such as these, act 310 may not be executed because no linearization is necessary.

At act 312, an output signal is provided by the power amplifier 202 to the output signal path 208. For example, the output signal may be amplified by the power amplifier 202 according to a gain of the power amplifier 202, and optionally linearized by the linearizer 204 in an amount determined to be appropriate by the linearizer 204. At act 314, the process 300 ends.

As discussed above with respect to act 308, the linearizer 204 may be configured to determine an appropriate amount of linearization based on a power level of the power amplifier 202. As used herein, an "amount of linearization" or a "degree of linearization" refers to how aggressively the linearizer 204 linearizes a signal provided by the power amplifier 202. An amount of linearization may be adjusted by modifying various linearization parameters, which may include a signal level (for example, a voltage level) of a bias signal provided by a bias generator of the power amplifier 202, electrical characteristics of circuit components of the amplifier system 200 that impact the input signal (for example, resistance, impedance, capacitance, inductance, and so forth), or other parameters that impact linearization of the power amplifier 202.

Figure 4:
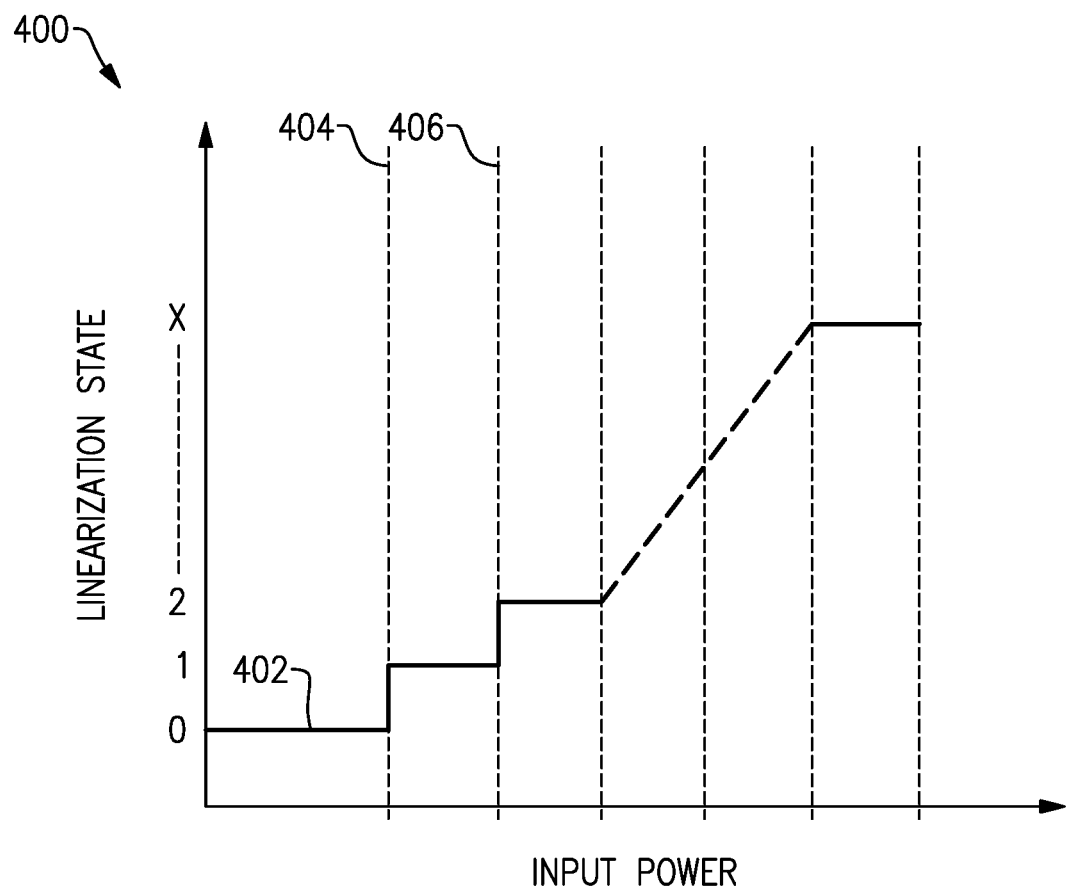
FIG. 4 illustrates a graph of linearization states which increase in a stepwise fashion with respect to a power level according to an example.

An amount of linearization provided by the linearizer 204 may increase in a stepwise fashion, analog fashion, or other fashion, with respect to input power. Examples of a stepwise and an analog linearization scheme are provided for purposes of explanation. For example, FIG. 4 illustrates a graph 400 of linearization states which increase in a stepwise fashion with respect to power level. A y-axis of the graph 400 indicates a linearization state of the linearizer 204, where a higher linearization state may indicate a greater amount of linearization. An x-axis of the graph 400 indicates a power level of the power amplifier 202. The graph 400 includes a trace 402, indicating linearization states that will be entered for various corresponding power levels.

As indicated by the trace 402, a discrete number of linearization states are provided. Although a particular number of linearization states are illustrated, any number of linearization states (including two linearization states, which may correspond to an "on," or "linearization," mode and an "off," or "no linearization," mode) may be implemented. Each linearization state corresponds to a range of power level values within which the linearizer 204 may enter a respective linearization state. For example, and with reference to FIG. 4, if a power level detected at act 306 is below a first power level 404, then the linearizer 204 may be in an off, or no linearization, mode. That is, the linearizer 204 may not provide any linearization to the power amplifier 202 in the off mode. Alternatively, if the power level is between the first power level 404 and a second power level 406, then a first linearization state may be entered. In at least one example, each power level may fall within a power range corresponding to a respective linearization state.

Furthermore, each power level may correspond to a respective amount of linearization to be provided by the linearizer 204. For example, each linearization state may correspond to a respective set of linearization parameters, with higher linearization states corresponding to linearization parameters that enable the linearizer 204 to provide a greater degree of linearization. Thus, as the power level increases, the linearizer 204 may enter higher linearization states corresponding to linearization parameters that enable the linearizer 204 to provide greater amounts of linearization.

Accordingly, the amplifier system 200 may repeatedly execute the process 300, and repeatedly determine which linearization state that the linearizer 204 should operate in. For example, if the power level determined at act 306 is between the first power level 404 and the second power level 406, then the linearizer 204 may enter the first linearization state. The first linearization state may correspond to a specific amount of linearization, which may in turn correspond to a specific set of linearization parameters as discussed above, such that the linearizer 204 provides linearization at act 310 in accordance with the linearization parameters dictated by the first linearization state.

Thus, in examples in which the linearizer 204 implements several discrete linearization states, the linearizer 204 repeatedly determines a power level of the power amplifier 202 and determines a linearization state corresponding to the power level. The linearizer 204 may subsequently provide an amount of linearization corresponding to the determined linearization state.

Figure 5:
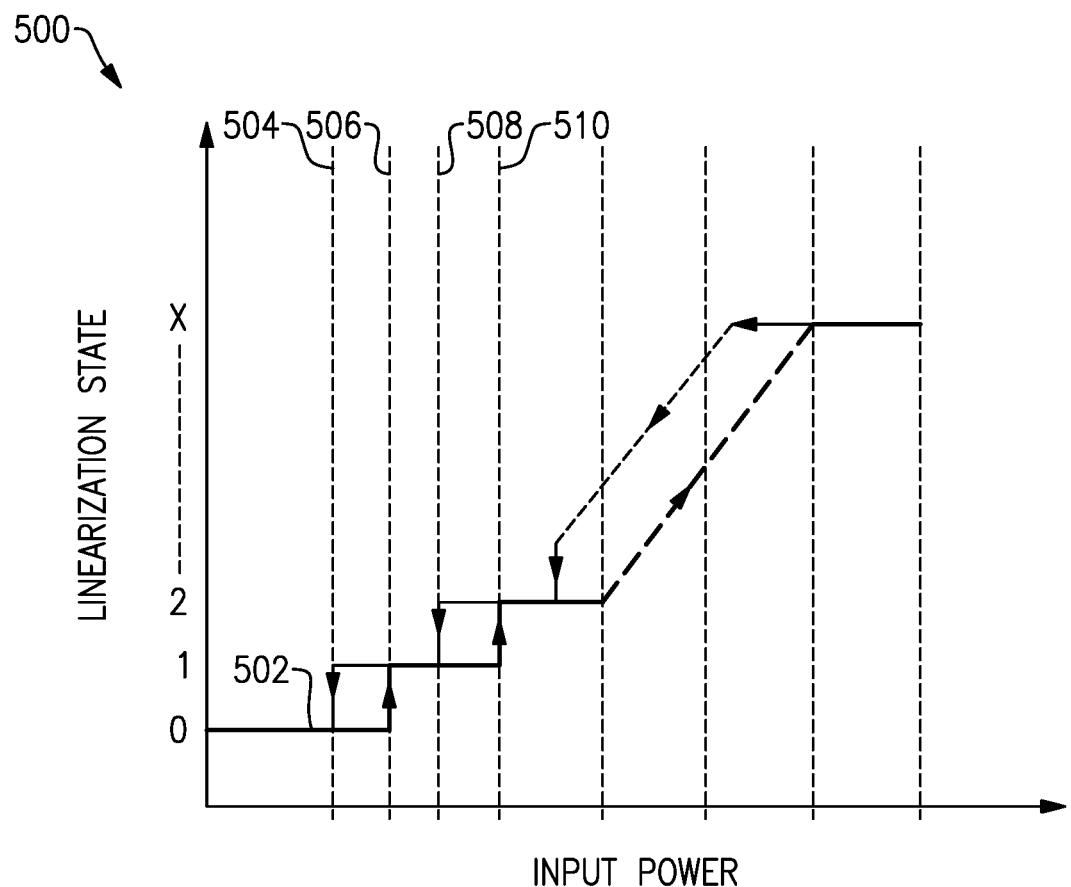
FIG. 5 illustrates a graph of linearization states which increase in a stepwise fashion with respect to a power level and with respect to a current linearization state according to an example.

In some examples, the linearizer 204 may exhibit hysteresis with respect to changing linearization states in a stepwise fashion. More particularly, a lower threshold for entering a particular linearization state may differ from (for example, be greater than) a lower threshold for exiting the particular linearization state. For example, FIG. 5 illustrates a graph 500 of linearization states of the linearizer 204 that increase and decrease in a stepwise fashion with respect to power level and with respect to a current linearization state. The graph 500 includes a trace 502, indicating linearization states that will be entered for various corresponding power levels.

The first linearization state, for example, is related to four power levels including a first power level 504, a second power level 506 which is greater than the first power level 504, a third power level 508 which is greater than the second power level 506, and a fourth power level 510 which is greater than the third power level 508. The second power level 506 and the fourth power level 510 indicate power levels that, if surpassed, will increment a linearization state of the linearizer 204, as indicated by the upward-facing arrows. More particularly, if the second power level 506 is surpassed, then the linearizer 204 may transition from the off mode to the first linearization state. If the fourth power level 510 is surpassed, then the linearizer 204 may transition from the first linearization state to a second linearization state.

The first power level 504 and the third power level 508 indicate power levels that, if fallen below, will decrement a linearization state of the linearizer 204, as indicated by the downward-facing arrows. More particularly, if the power level falls below the first power level 504, then the linearizer 204 may transition from the first linearization state to the off mode. If the power level falls below the third power level 508, then the linearizer 204 may transition from the second linearization state to the first linearization state.

In an illustrative example, a power level of the linearizer 204 is below the first power level 504, and the linearizer 204 is thus in an off state corresponding to a linearization level of zero. As the power level increases past the second power level 506, the linearizer 204 transitions from the off state to the first linearization state. If the power level subsequently decreases below the second power level 506, the linearizer 204 may remain in the first linearization state. In the power level continues to decrease and subsequently decreases below the first power level 504, however, then the linearizer 204 may transition to the off state. Thus, if a power level were to rapidly fluctuate around the second power level 506, the linearizer 204 may not disadvantageously flicker in and out of the first linearization state (i.e., because the linearizer 204 transitions from the first linearization state to the "off" state at the first power level 504, not the second power level 506).

After decreasing below the first power level 504, the power level may subsequently increase past the second power level 506, and the linearizer 204 may transition back into the first linearization state. If the power level subsequently increases past the third power level 508, the linearizer 204 may remain in the first linearization state, because the third power level 508 corresponds to a transition point only from the second linearization state to the first linearization state. If the power level continues to increase and subsequently increases above the fourth power level 510, however, then the linearizer may transition from the first linearization state to the second linearization state. If the power level subsequently decreases below the third power level 508, then the linearizer 204 may transition back from the second linearization state to the first linearization state.

It is to be appreciated that, while each of the graphs 400, 500 indicates an example implementation of linearization states, other examples are within the scope of the disclosure. For example, while in some embodiments each linearization state may correspond to a similar or identical range of power level values, in other examples the linearization states may correspond to different ranges of power level values. Similarly, while in some examples each successive linearization state may increase an amount of linearization by a similar or identical amount, in other examples the linearization states may correspond to different changes in the amount of linearization.

While the lower thresholds for entering and leaving a particular linearization state may differ by a similar or identical amount for each linearization state in some examples, in other examples, the lower thresholds may differ by different amounts for some linearization states. Furthermore, while the lower threshold for leaving a first linearization state may be greater than a lower threshold for entering a second linearization state below the first linearization state, in other embodiments, the lower threshold for leaving a first linearization state may be lower than a lower threshold for entering a second linearization state which is below the first linearization state. For example, while the third power level 508 is illustrated as being greater than the second power level 506 in one example, in other examples the third power level 508 may be lower than the second power level 506.

Figure 6:
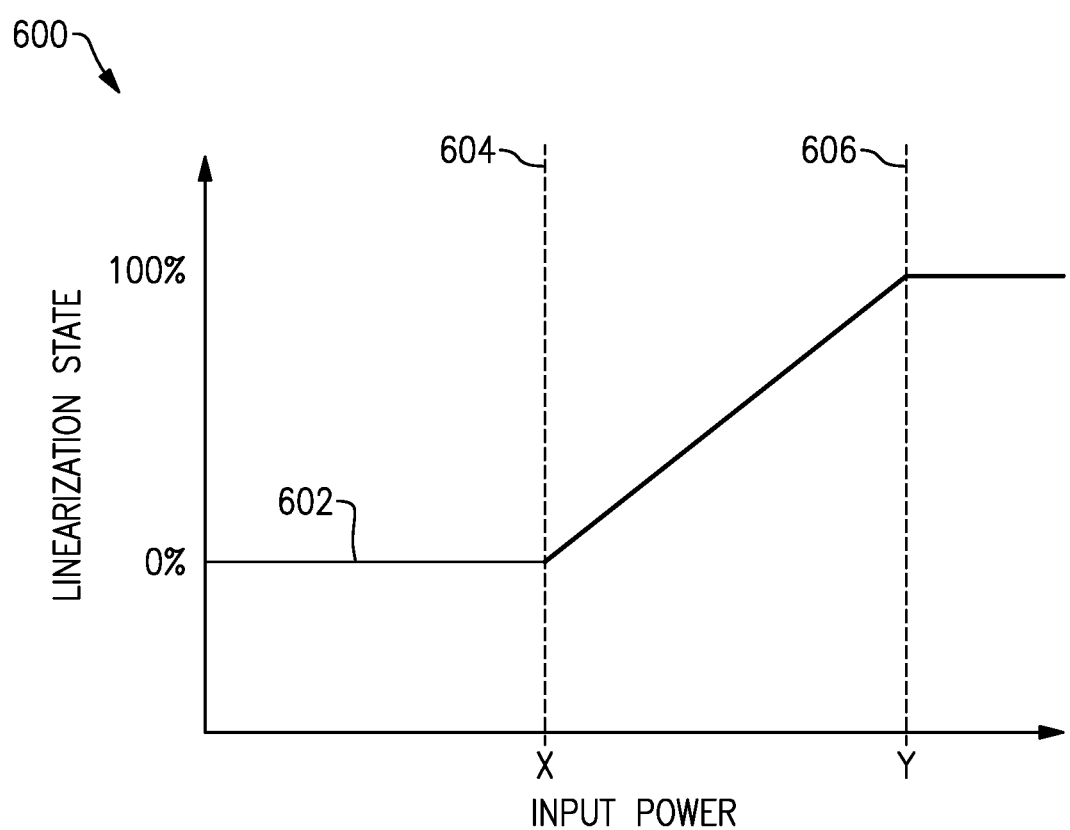
FIG. 6 illustrates a graph of linearization states which increase in an analog fashion with respect to a power level according to an example.

As discussed above, an amount of linearization provided by the linearizer 204 may alternately increase in an analog fashion. For example, FIG. 6 illustrates a graph 600 of linearization states that increase in an analog fashion with respect to power level. A y-axis of the graph 600 indicates an amount of linearization provided by the linearizer 204. An x-axis of the graph 600 indicates a power level of the power amplifier 202. The graph 600 includes a trace 602, indicating an amount of linearization that will be provided by the linearizer 204 for a corresponding power level.

As indicated by the graph 600, a slope of the trace 602 changes at a first power level 604 and at a second power level 606. For power levels below the first power level 604, the linearizer 204 may be in an "off," or "no linearization," mode. As the power level increases from the first power level 604 to the second power level 606, an amount of linearization provided by the linearizer 204 increases in an analog fashion. For example, linearization parameters may be ramped up in an analog fashion as the power level increases. As the power level increases beyond the second power level 606, the amount of linearization provided by the linearizer 204 plateaus at a maximum amount of linearization, beyond which the amount of linearization no longer increases.

Figure 7:
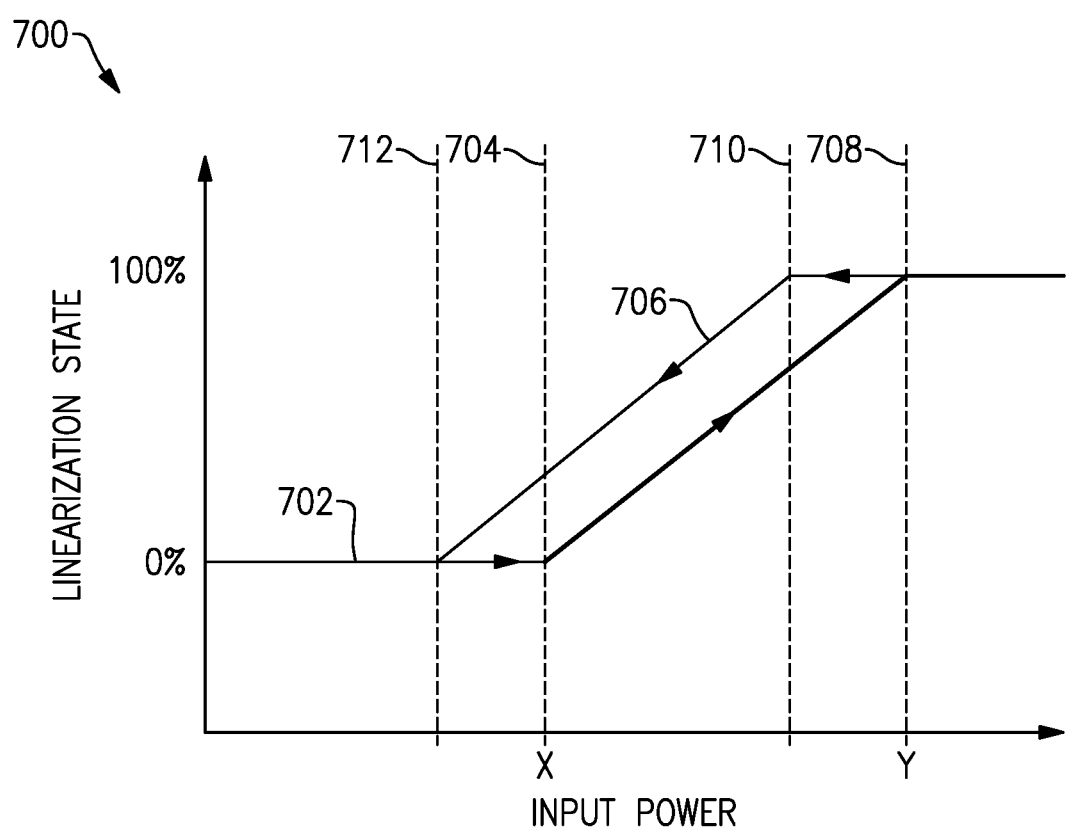
FIG. 7 illustrates a graph of linearization states which increase in an analog fashion with respect to a power level and with respect to a current linearization state according to an example.

In some examples, the linearizer 204 may exhibit hysteresis with respect to changing an amount of linearization in an analog fashion. More particularly, a lower threshold for ramping down from providing the maximum amount of linearization may differ from (for example, be lower than) an upper threshold for initially providing the maximum amount of linearization. For example, FIG. 7 illustrates a graph 700 of linearization states of the linearizer 204 that increase and decrease in an analog fashion with respect to power level and with respect to a current linearization state.

The graph 700 includes a first trace 702 indicating an amount of linearization provided by the linearizer 204 as a power level of the power amplifier 202 increases beyond a first power level 704 corresponding to a "no linearization" mode, as indicated by the upward-facing arrows. The graph 700 further includes a second trace 706 indicating an amount of linearization provided by the linearizer 204 as a power level of the power amplifier 202 decreases below a second power level 708 corresponding to a maximum amount of linearization, as indicated by the downward-facing arrows. Thus, if the linearizer 204 is providing a maximum amount of linearization and the power level subsequently falls below the second power level 708, the linearizer 204 may continue providing the maximum amount of linearization until and unless the power level falls below a third power level 710. As a power level of the power amplifier 202 decreases below the third power level 710, an amount of linearization provided may continue to decrease until the power level reaches a fourth power level 712, which may be lower than the first power level 704. Subsequent to falling below the fourth power level 712, the linearizer 204 provides no linearization until the power level again exceeds the first power level 704.

It is to be appreciated that, while each of the graphs 600, 700 indicates an example implementation of linearization states, other examples are within the scope of the disclosure. For example, while an amount of linearization may increase in a linear fashion, in other examples, the amount of linearization may increase in an exponential fashion, a logarithmic fashion, a partially stepwise fashion, or any combination of the foregoing. Furthermore, it is to be appreciated that any values corresponding to respective linearization states are provided for purposes of example only. For example, while the graphs 600, 700 indicate an off mode, in other examples, an amount of linearization may increase in an analog fashion for any power levels above a power level of zero.

Accordingly, it is to be appreciated that the linearizer 204 may provide varying degrees of linearization in accordance with one or more of several implementations, including a stepwise implementation and an analog implementation, which may include hysteresis functionality. Although particular examples have been provided for purposes of explanation, other implementations are within the scope of the disclosure.

An example implementation of an amplifier system, which may be similar to the amplifier system 200, will now be described. A power amplifier, such as the power amplifier 202, may be implemented in accordance with any of several amplifier topologies. For purposes of explanation only, examples will be provided in which a power amplifier is implemented in accordance with a cascode amplifier topology. However, it is to be appreciated that, in other examples, a power amplifier similar to the power amplifier 202 may be implemented in accordance with a topology other than a cascode amplifier topology.

A cascode amplifier is a two-stage amplifier including a common emitter stage feeding into a common base stage for bipolar technologies, or a common source stage feeding into a common gate stage for field-effect transistor (FET) technologies. Compared to a single-stage amplifier, a cascode amplifier may exhibit higher input-output isolation, higher input impedance, higher output impedance, higher gain, and higher bandwidth. A cascode is often constructed from two transistors with one operating as common source and the other as a common gate. The cascode improves input-output isolation and bandwidth as there is no direct coupling from the output to input.

Figure 8:
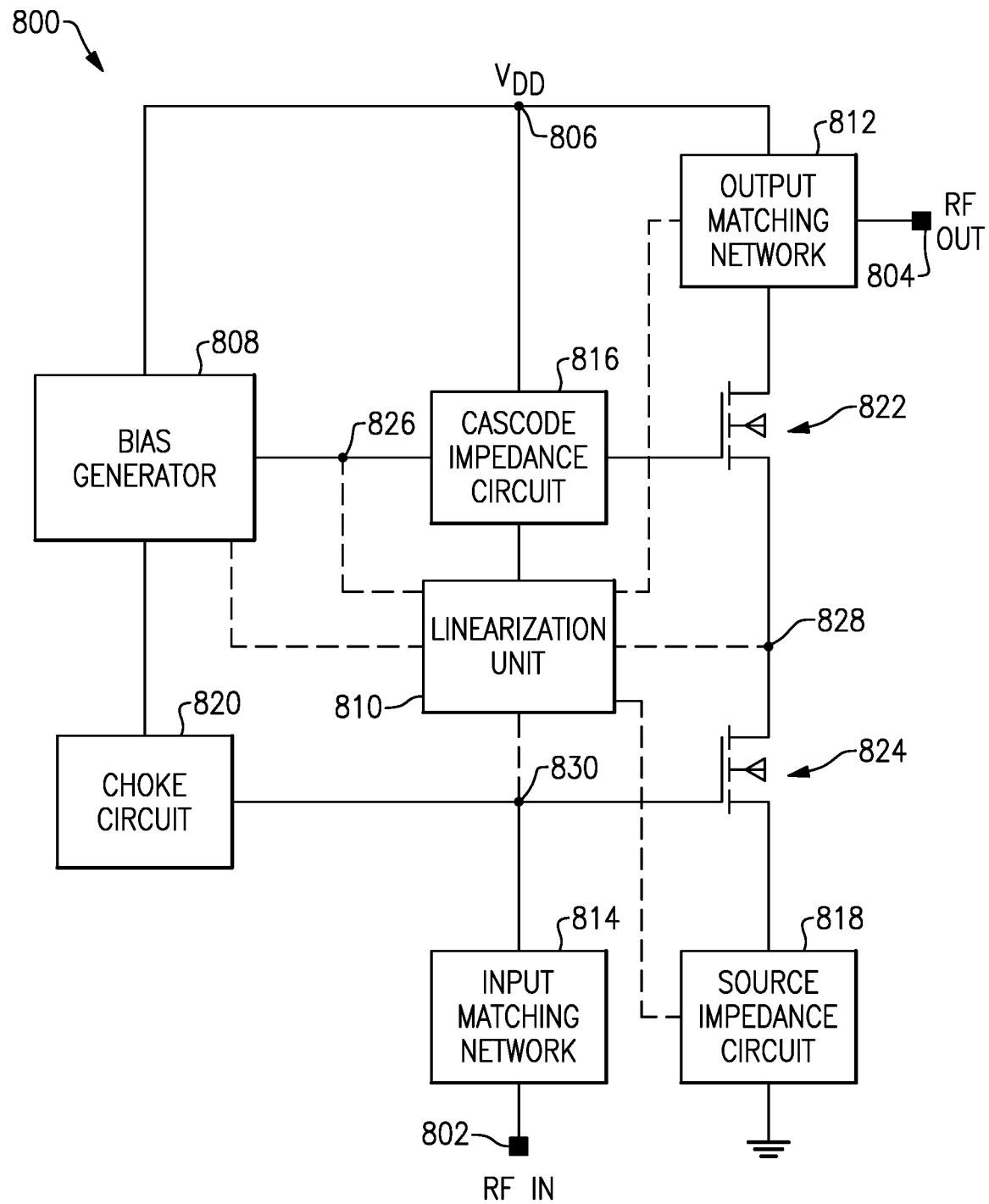
FIG. 8 illustrates a block diagram of an amplifier system according to an example.

FIG. 8 illustrates a block diagram of an amplifier system 800 according to one example of the disclosure. For example, the amplifier system 800 may an example of the amplifier system 200. Elements of the amplifier system 800 may include elements of one or both of the power amplifier 202 and the linearizer 204.

The amplifier system 800 includes a signal input 802, a signal output 804, a voltage supply node ($V_{DD}$) 806, a bias generator 808, a linearization unit 810, an output matching network 812, an input matching network 814, a cascode impedance circuit 816, a source impedance circuit 818, a choke circuit 820, a first switch 822, and a second switch 824.

The signal input 802 is coupled to the input matching network 814, and is configured to be coupled to a source of a signal. For example, and as discussed above, the source of the signal may provide an RF signal to the amplifier system 800. The signal output 804 is coupled to the output matching network 812, and is configured to be coupled to a load. For example, the signal output 804 may be configured to be coupled to an antenna to which the signal output 804 provides an amplified signal.

The voltage supply node 806 is coupled to the bias generator 808, the output matching network 812, and the cascode impedance circuit 816. The voltage supply node 806 is further configured to be coupled to a power source, which provides a voltage $V_{DD}$. The bias generator 808 is coupled to the voltage supply node 806, the linearization unit 810, the cascode impedance circuit 816, and the choke circuit 820. The linearization unit 810 is configured to be electrically and/or communicatively coupled to the bias generator 808, the output matching network 812, the cascode impedance circuit 816, the source impedance circuit 818, a first node 826 connecting the bias generator 808 and the cascode impedance circuit 816, a second node 828 connecting a source of the first switch 822 to a drain of the second switch 824, and a third node 830 connecting the input matching circuit 814, the choke circuit 820, and a gate of the second switch 824.

The output matching network 812 is coupled to the signal output 804, the voltage supply node 806, the linearization unit 810, and a drain of the first switch 822. The input matching network 814 is coupled to the signal input 802, the choke circuit 820, and the gate of the second switch 824. The cascode impedance circuit 816 is coupled to the voltage supply node 806, the bias generator 808, the linearization unit 810, and a gate of the first switch 822. The source impedance circuit 818 is coupled to the linearization unit, a source of the second switch 824, and a reference node (for example, a ground node).

The choke circuit 820 is coupled to the bias generator 808, the input matching network 814, and the gate of the second switch 824. The drain of the first switch 822 is coupled to the output matching network 812, the gate of the first switch 822 is coupled to the cascode impedance circuit 816, and the source of the first switch 822 is coupled to the drain of the second switch 824. The drain of the second switch 824 is coupled to the source of the first switch 822, the gate of the second switch 824 is coupled to the input matching network 814 and the choke circuit 820, and the source of the second switch 824 is coupled to the source impedance circuit 818.

Operation of components of the amplifier system 800 will now be described. The signal input 802 is configured to receive an input signal, such as an RF signal. As discussed in greater detail below, the input signal is amplified by the amplifier system 800 to produce an amplified signal. The amplified signal is output at the signal output 804 to a load, such as an antenna. An amount of amplification provided by the amplifier system 800 is dictated at least in part by bias signals provided by the bias generator 808 and electrical characteristics of various components of the amplifier system 800.

The linearization unit 810 is configured to control an amount of linearization provided to the amplifier system 800. The linearization unit 810 may control the amount of linearization at least in part by controlling bias signals provided by the bias generator 808 and electrical characteristics of various components of the amplifier system 800. The linearization unit 810 may be implemented using one of several linearizer topologies including, for example, a pre-distortion topology, a feedback topology, a feed-forward topology, or others. Accordingly, the linearization unit 810 may include additional or fewer connections than those illustrated in connection with FIG. 8 depending on a topology of the linearization unit 810. Furthermore, the linearization unit 810 may include additional or fewer components than certain existing linearizer topologies, such that an appropriate amount of linearization to be provided to the amplifier system 800 may be determined and provided.

As discussed above, the amplifier system 800 is configured in a cascode amplifier topology in which the second switch 824 acts as a common source stage, feeding into the first switch 822, which acts as a common gate stage. The cascode impedance circuit 816 and the source impedance circuit 818, amongst other components and as discussed in greater detail below, are configured to tune operation of the amplifier system 800 (including, for example, an amount of linearization).

The input matching network 814 is configured to match an input impedance and thereby maximize input power transfer. The input matching network 814 may include one of several existing topologies including, for example, a series inductor coupled to a shunt capacitor. The output matching network 812 is configured to match a load impedance and thereby reduce signal reflection at the signal output 804. The output matching network 812 may include one of several existing topologies including, for example, one or more resistors, capacitors, and/or inductors. The choke circuit 820 is configured to prevent high-frequency signals from reaching the bias generator 808. For example, the choke circuit 820 may include one or more inductors, resistors, and/or capacitors. The bias generator 808 is configured to provide one or more bias signals to components of the amplifier system 800.

An amount of amplification provided by the amplifier system 800 is dependent on parameters including, for example, the value of bias signals provided by the bias generator 808, and electrical parameters (including, for example, an impedance) of components including the output matching network 812, the input matching network 814, the cascode impedance circuit 816, the source impedance circuit 818.

Accordingly, an amount of linearization and/or amplification of the output signal provided at the signal output 804 may be modulated by modulating these parameters. As used in connection with FIG. 8, the term "linearization parameters" is used to refer to a group of modifiable parameters that impact the amount of linearization provided by the linearization unit 810, and may include the value of the bias signals provided by the bias generator 808 and the electrical parameters of components including the components 812, 816, and 818. The linearization unit 810 may be operable to control and modulate the linearization parameters. For example, the linearization unit 810 may determine a power level of the amplifier system 800, and control the linearization parameters based on a linearization state corresponding to the determined power level.

To determine the power level, the linearization unit 810 may include or be otherwise coupled to one or more sensors configured to measure electrical characteristics (for example, a current, a voltage, a power, and so forth) of the components and/or nodes to which the linearization unit 810 is coupled. For example, the linearization unit 810 may include or be otherwise coupled to one or more sensors configured to determine a power level at the third node 830. Based on the determined power level, the linearization unit 810 may determine an amount of linearization to provide.

To provide the desired amount of linearization, the linearization unit 810 may control one or more linearization parameters. As discussed above, the linearization parameters may include the value of the bias signals provided by the bias generator 808, and/or the electrical parameters of components including the components 812, 816, and 818. To control the value of the bias signals provided by the bias generator 808, the linearization unit 810 may provide one or more control signals to the bias generator 808 indicating a desired value of the bias signals. The bias generator 808 may, in turn, provide the bias signals according to the control signals received from the linearization unit 810. Accordingly, the linearization unit 810 may, by controlling operation of the bias generator 808, control bias signals provided to components of the amplifier system 800 and thereby control an amount of linearization provided to an output signal. It is to be appreciated that the bias generator 808 is indicated as a separate component for purposes of example only and, in some examples, the linearization unit 810 may include some or all of the components of the bias generator 808.

To control the electrical parameters of components including the components 812, 816, and 818, the linearization unit 810 may be configured to control a topology or characteristics of the components. For example, the components 812, 816, and 818 may include various electrical components (including, for example, capacitors, inductors, and resistors) configured to be switchable in and out of a conductive path by the linearization unit 810, or may include components having independently variable impedances, such that an impedance of the components 812, 816, and 818 may be controlled.

Figure 9:
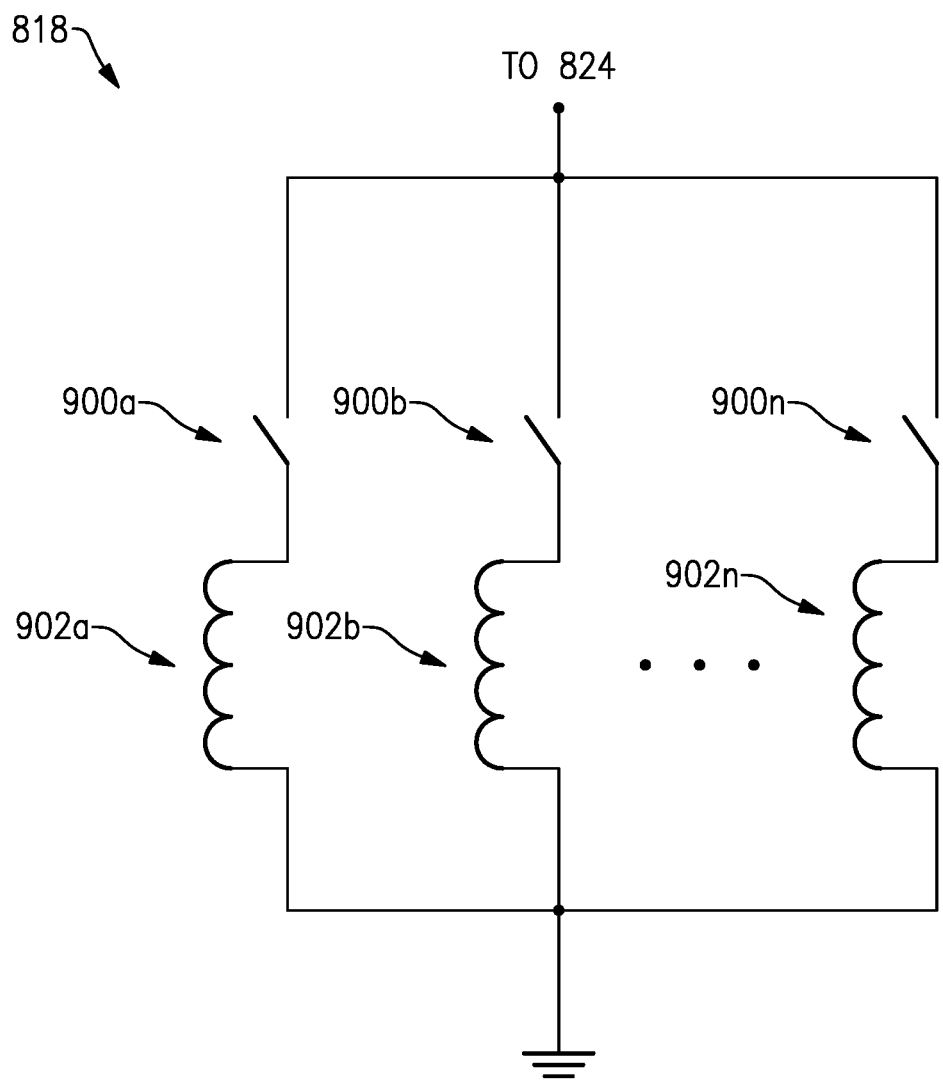
FIG. 9 illustrates a schematic diagram of a source impedance circuit according to an example.

To illustrate an example the foregoing, FIG. 9 illustrates a schematic diagram of an example of the source impedance circuit 818. The source impedance circuit 818 includes switches 900a-900n and inductors 902a-902n. Each of the switches 900a-900n is coupled in series with a respective one of the inductors 902a-902n, and each series combination is coupled between the second switch 824 and the reference node. The switches 900a-900n may be controllable by the linearization unit 810. The inductors 902a-902n may have the same or different inductances.

As will be appreciated by one of ordinary skill in the art, a total inductance between the second switch 824 and the reference node is dependent on which, if any, of the switches 900a-900n are in a closed and conducting position. The total inductance, in turn, modifies operating properties of the cascode amplifier. For example, the total inductance may modify a degree of amplification and/or linearization provided by the amplifier system 800. Accordingly, the linearization unit 810 may, by controlling states of the switches 900a-900n, control electrical parameters of the source impedance circuit 818 and thereby control an amount of linearization provided to an output signal.

Although FIG. 9 provides an example in which the source impedance circuit 818 includes inductors, in other examples, the source impedance circuit 818 may be implemented with any combination of resistors, inductors, capacitors, and so forth, having electrical properties modifiable by the linearization unit 810. Similar principles may apply to the output matching network 812 and the cascode impedance circuit 816. For example, the output matching network 812 and/or the cascode impedance circuit 816 may include one or more inductors, capacitors, resistors, LC tank circuits, or other components, capable of being switchably connected or disconnected such that the electrical characteristics of the components 812, 816 may be controlled. It is therefore to be appreciated that the linearization unit 810 may control electrical parameters of the amplifier system 800 by switchably modifying a circuit topology of various components of the amplifier system 800.

Accordingly, examples have been provided in which the linearization unit 810 determines a power level of the amplifier system 800, determines an appropriate amount of linearization to provide based on the power level, and controls one or more linearization parameters corresponding to the appropriate amount of linearization. The one or more linearization parameters may include, for example, a bias signal provided by the bias generator 808 and/or electrical parameters of one or more of the components 812, 816, and 818.

It is to be appreciated, however, that the amplifier system 800 is provided as one example of the principles disclosed herein. Alternate amplifier system topologies are within the scope of this disclosure, in which a linearization unit (similar, for example, to the linearization unit 810) determines and provides an amount of linearization corresponding to operation of the amplifier system, such as a power level. For example, although examples have been provided in which a cascode amplifier topology is described, it is to be appreciated that the principles of the disclosure are applicable to various other amplifier topologies.

Similarly, although examples have been provided in which the linearization unit 810 controls electrical parameters of certain components of the amplifier system 800, in various examples a linearization unit may control any electrical parameters of any components including, for example, an input matching network, or components not illustrated in the amplifier system 800.

As discussed above, the linearization unit 810 is illustrated as a separate component from other components of the amplifier system 800 for purposes of example only. In some examples, a linearization unit may include logical components in addition to power components. A linearization unit may include one or more electrical components having electrical characteristics controllable by the linearization unit and capable of impacting an amount of linearization and/or amplification provided by an amplifier system in which the linearization unit is implemented. For example, a linearization unit may include one or more electrical components (for example, inductors, resistors, capacitors, or combinations thereof) having electrical characteristics (for example, inductance, resistance, and/or capacitance) controllable by the linearization unit (for example, switchably controllable) and capable of impacting an amount of linearization provided by an amplifier system in which the linearization unit is implemented.

In certain embodiments, the linearization unit 810 can be configured to facilitate implementation of various processes on the amplifier system 800. The linearization unit 810 can be, for example, implemented using hardware, software, or a combination of hardware and software. For instance, the linearization unit 810 may include one or more microprocessors or other types of controllers that can perform a series of instructions that manipulate data. However, in other examples the linearization unit 810 may include specially programmed, special-purpose hardware, such as, for example, an application-specific integrated circuit tailored to perform particular operations disclosed herein. In certain implementations, the amplifier system 800 can include a non-transitory computer-readable medium, such as a memory or storage, which can store computer program instructions that may be provided to and executed by the linearization unit 810.

Having described above several aspects of at least one example, it is to be appreciated that various alterations, modifications, and improvements will readily occur to those skilled in the art. Such alterations, modifications and improvements are intended to be part of this disclosure and are intended to be within the scope of the invention.

Accordingly, the foregoing description and drawings are by way of example only, and the scope of the invention should be determined from proper construction of the appended claims, and their equivalents.

What is claimed is:

1. An amplifier system comprising:
an amplifier having an input to receive an input signal, and an output to provide an amplified output signal, the amplifier having a power level indicative of at least one of the input signal and the amplified output signal; and
a linearizer coupled to the amplifier and having a plurality of modes of operation including a fully disabled mode in which the linearizer provides no linearization and a fully enabled mode in which the linearizer provides a maximum amount of linearization, the linearizer being configured to
select a mode of operation of the plurality of modes of operation based on the power level of the amplifier,
determine one or more linearization parameters corresponding to the selected mode of operation, and
control linearization of the amplified output signal based on the determined one or more linearization parameters.

2. The amplifier system of claim 1 wherein the plurality of modes of operation includes a plurality of discrete modes of operation.

3. The amplifier system of claim 1 wherein the plurality of modes of operation includes a plurality of analog modes of operation.

4. The amplifier system of claim 1 further comprising a bias generator configured to provide one or more bias signals to the amplifier, wherein the linearizer is configured to determine the one or more linearization parameters by determining a respective bias level for each of the one or more bias signals and providing one or more control signals indicative of the determined respective bias levels to the bias generator.

5. The amplifier system of claim 1 wherein the amplifier includes a plurality of resistive, inductive, and/or capacitive components to control an amplification of the amplified output signal, and wherein in determining the one or more linearization parameters, the linearizer is configured to determine one or more electrical parameters for at least one component of the plurality of resistive, inductive, and/or capacitive components and control the at least one component to have the one or more electrical parameters.

6. The amplifier system of claim 5 wherein in controlling the at least one component to have the one or more electrical parameters, the linearizer is configured to control a component topology of the at least one component.

7. The amplifier system of claim 6 wherein in controlling the component topology of the at least one component, the linearizer is configured to electrically connect or disconnect one or more inductors, capacitors, and/or resistors in the at least one component.

8. The amplifier system of claim 1 wherein the linearizer is configured to select the mode of operation of the plurality of modes of operation based on a present mode of operation of the linearizer of the plurality of modes of operation and based on the power level of the amplifier.

9. A method of controlling a linearizer coupled to an amplifier having a power level indicative of at least one of an input signal received by the amplifier and an amplified output signal provided by the amplifier, the linearizer having a plurality of modes of operation including a fully disabled mode in which the linearizer provides no linearization and a fully enabled mode in which the linearizer provides a maximum amount of linearization, the method comprising:
selecting a mode of operation of the plurality of modes of operation based on the power level of the amplifier;
determining one or more linearization parameters corresponding to the selected mode of operation; and
controlling linearization of the amplified output signal based on the determined one or more linearization parameters.

10. The method of claim 9 wherein selecting the mode of operation of the plurality of modes of operation includes selecting a discrete mode of operation of a plurality of discrete modes of operation.

11. The method of claim 9 wherein selecting the mode of operation of the plurality of modes of operation includes selecting an analog mode of operation of a plurality of analog modes of operation.

12. The method of claim 9 wherein the linearizer is coupled to a bias generator configured to provide one or more bias signals to the amplifier, and wherein determining the one or more linearization parameters includes:
determining a respective bias level for each of the one or more bias signals; and
providing one or more control signals indicative of the determined respective bias levels to the bias generator.

13. The method of claim 9 wherein the amplifier includes a plurality of resistive, inductive, and/or capacitive components to control an amplification of the amplified output signal, and wherein determining the one or more linearization parameters includes:
determining one or more electrical parameters for at least one component of the plurality of resistive, inductive, and/or capacitive components; and
controlling the at least one component to have the one or more electrical parameters.

14. The method of claim 13 wherein controlling the at least one component to have the one or more electrical parameters includes controlling a component topology of the at least one component.

15. The method of claim 14 wherein controlling the component topology of the at least one component includes electrically connecting or disconnecting one or more inductors, capacitors, and/or resistors in the at least one component.

16. The method of claim 9 wherein selecting the mode of operation of the plurality of modes of operation is performed based on a present mode of operation of the plurality of modes of operation and based on the power level of the amplifier.

17. A linearizer coupled to an amplifier having a power level indicative of at least one of an input signal received by the amplifier and an amplified output signal provided by the amplifier, the linearizer having a plurality of modes of operation including a fully disabled mode in which the linearizer provides no linearization and a fully enabled mode in which the linearizer provides a maximum amount of linearization, and being configured to:
- select a mode of operation of the plurality of modes of operation based on the power level of the amplifier;
- determine one or more linearization parameters corresponding to the selected mode of operation; and
- control linearization of the amplified output signal based on the determined one or more linearization parameters.

18. The linearizer of claim 17 wherein the linearizer is further configured to be coupled to a bias generator configured to provide one or more bias signals to the amplifier, and wherein in determining the one or more linearization parameters, the linearizer is configured to determine a respective bias level for each of the one or more bias signals and provide one or more control signals indicative of the determined respective bias levels to the bias generator.

19. The linearizer of claim 17 wherein the amplifier includes a plurality of resistive, inductive, and/or capacitive components to control an amplification of the amplified output signal, and wherein in determining the one or more linearization parameters, the linearizer is configured to determine one or more electrical parameters for at least one component of the plurality of resistive, inductive, and/or capacitive components and control the at least one component to have the one or more electrical parameters.

20. The linearizer of claim 19 wherein in controlling the at least one component to have the one or more electrical parameters, the linearizer is configured to electrically connect or disconnect one or more inductors, capacitors, and/or resistors in the at least one component.

* * * * *